(12) United States Patent
Batson

(10) Patent No.: US 7,205,746 B2
(45) Date of Patent: *Apr. 17, 2007

(54) BATTERY COVER ASSEMBLY HAVING INTEGRATED BATTERY CONDITION MONITORING

(75) Inventor: David C. Batson, Winchester, MA (US)

(73) Assignee: Microchip Technology Inc., Chandler, AZ (US)

( * ) Notice: Subject to any disclaimer, the term of this patent is extended or adjusted under 35 U.S.C. 154(b) by 424 days.
This patent is subject to a terminal disclaimer.

(21) Appl. No.: 10/853,983

(22) Filed: May 25, 2004

(65) Prior Publication Data

US 2004/0212342 A1    Oct. 28, 2004

Related U.S. Application Data

(63) Continuation-in-part of application No. 10/419,600, filed on Apr. 21, 2003, now Pat. No. 7,012,404, which is a continuation of application No. 10/010,693, filed on Dec. 5, 2001, now Pat. No. 6,628,102.

(60) Provisional application No. 60/282,133, filed on Apr. 6, 2001.

(51) Int. Cl.
    *H02J 7/00*    (2006.01)
(52) U.S. Cl. .................... 320/107; 324/429; 324/430; 320/150; 338/22 R
(58) Field of Classification Search ............... 320/107; 324/429, 430; 307/9.1; 429/100; 338/22 R
See application file for complete search history.

(56) References Cited

U.S. PATENT DOCUMENTS 3,660,759 A * 5/1972 Parmater .................... 324/429

(Continued)

OTHER PUBLICATIONS

PowerSmart Product Data, PS3180 SmartShunt TM Battery Monitor, 2000, Rev. A, pp. 1-2 and 1-6.

(Continued)

*Primary Examiner*—Karl Easthom
*Assistant Examiner*—Samuel Berhanu
(74) *Attorney, Agent, or Firm*—Baker Botts L.L.P.

(57) ABSTRACT

A battery cover assembly having integrated battery condition monitoring for measuring electrical current passing to and from a battery post, including an electrically conductive collar for connecting to a post of a battery, and an electrically conductive terminal for receiving a connector of a load. An electrically conductive resistor having a known resistance extends between outer surfaces of the collar and the terminal. The battery cover assembly is incorporated into a battery, which may also include a voltage measuring device connected between the outer surfaces of the collar and the terminal for measuring the voltage drop across the resistor, memory for storing the known resistance of the resistor, and a digital processor programmed to receive the measured voltage drop from the voltage measuring device, retrieve the known resistance from the memory, and calculate current flow through the resistor based on the measured voltage drop and the known resistance, whereby current flow to and from the battery can be measured. A temperature measuring device may also be incorporated to measure temperature of the resistor located between the outer surfaces of the collar and the terminal. A resistance-temperature table may be stored in the memory and used to calculate the actual resistance of the resistor and then to compensate the current value from the voltage measured across the resistor.

26 Claims, 7 Drawing Sheets

U.S. PATENT DOCUMENTS

| | | | | |
|---|---|---|---|---|
| 4,021,718 | A | 5/1977 | Konrad | 320/48 |
| 4,045,721 | A | 8/1977 | Swain | 320/43 |
| 4,081,693 | A | 3/1978 | Stone | 307/66 |
| 4,180,770 | A | 12/1979 | Eby | 324/429 |
| 4,193,025 | A | 3/1980 | Frailing et al. | 324/427 |
| 4,349,775 | A | 9/1982 | Kwon et al. | 320/35 |
| 4,396,880 | A | 8/1983 | Windebank | 320/21 |
| 4,460,870 | A | 7/1984 | Finger | 324/429 |
| 4,470,654 | A | 9/1984 | Friedman | 439/435 |
| 4,558,281 | A | 12/1985 | Codd et al. | 324/433 |
| 4,564,798 | A | 1/1986 | Young | 320/6 |
| 4,583,036 | A | 4/1986 | Morishita et al. | 320/39 |
| 4,629,964 | A | 12/1986 | Ball | 320/14 |
| 4,678,998 | A | 7/1987 | Muramatsu | 324/427 |
| 4,709,202 | A | 11/1987 | Koenck et al. | 320/43 |
| 4,876,513 | A | 10/1989 | Brilmyer et al. | 324/427 |
| 4,924,176 | A | 5/1990 | Tremblay | 324/133 |
| 4,937,528 | A | 6/1990 | Palanisamy | 324/430 |
| 4,947,123 | A | 8/1990 | Minezawa | 324/427 |
| 4,968,942 | A | 11/1990 | Palanisamy | 324/430 |
| 5,047,961 | A | 9/1991 | Simonsen | 364/550 |
| 5,049,803 | A | 9/1991 | Palanisamy | 320/20 |
| 5,132,626 | A | 7/1992 | Limuti et al. | 324/432 |
| 5,160,880 | A | 11/1992 | Palanisamy | 320/32 |
| 5,191,291 | A | 3/1993 | Taylor | 324/429 |
| 5,250,904 | A | 10/1993 | Salander et al. | 324/430 |
| 5,281,919 | A | 1/1994 | Palanisamy | 324/427 |
| 5,321,347 | A | 6/1994 | Chien | 320/21 |
| 5,321,627 | A | 6/1994 | Reher | 364/483 |
| 5,339,018 | A | 8/1994 | Brokaw | 320/35 |
| 5,345,163 | A | 9/1994 | Gibbons et al. | 320/48 |
| 5,365,453 | A * | 11/1994 | Startup et al. | 702/63 |
| 5,432,429 | A | 7/1995 | Armstrong, II et al. | 320/43 |
| 5,469,043 | A | 11/1995 | Cherng et al. | 320/31 |
| 5,496,658 | A * | 3/1996 | Hein et al. | 429/93 |
| 5,541,489 | A | 7/1996 | Dunstan | 320/2 |
| 5,546,317 | A | 8/1996 | Andrieu | 364/481 |
| 5,550,475 | A | 8/1996 | Shafer | 324/433 |
| 5,557,188 | A * | 9/1996 | Piercey | 320/134 |
| 5,559,500 | A * | 9/1996 | Kase | 340/664 |
| 5,565,759 | A | 10/1996 | Dunstan | 320/48 |
| 5,572,110 | A | 11/1996 | Dunstan | 320/30 |
| 5,598,088 | A | 1/1997 | Richter | 320/48 |
| 5,600,230 | A | 2/1997 | Dunstan | 320/48 |
| 5,617,007 | A | 4/1997 | Keidl et al. | 320/22 |
| 5,627,453 | A | 5/1997 | Sheehan et al. | 320/30 |
| 5,629,680 | A | 5/1997 | Makhija | 340/664 |
| 5,631,540 | A | 5/1997 | Nguyen | 320/30 |
| 5,635,820 | A | 6/1997 | Park | 320/30 |
| 5,642,030 | A * | 6/1997 | Seelye | 320/101 |
| 5,652,069 | A | 7/1997 | Sakai et al. | 429/92 |
| 5,656,920 | A | 8/1997 | Cherng et al. | 320/31 |
| 5,656,978 | A * | 8/1997 | Bianu et al. | 333/81 R |
| 5,659,240 | A | 8/1997 | King | 320/30 |
| 5,670,863 | A | 9/1997 | Broell et al. | 320/22 |
| 5,708,348 | A | 1/1998 | Frey et al. | 320/21 |
| 5,710,503 | A | 1/1998 | Sideris et al. | 320/6 |
| 5,710,506 | A | 1/1998 | Broell et al. | 320/522 |
| 5,712,795 | A * | 1/1998 | Layman et al. | 700/297 |
| 5,734,252 | A | 3/1998 | Griffin et al. | 320/2 |
| 5,739,670 | A | 4/1998 | Brost et al. | 320/14 |
| 5,808,445 | A | 9/1998 | Aylor et al. | 320/132 |
| 5,825,156 | A | 10/1998 | Patillon et al. | 320/21 |
| 5,828,201 | A | 10/1998 | Hoffman, Jr. et al. | 320/104 |
| 5,841,284 | A | 11/1998 | Takahasi | 324/428 |
| 5,889,382 | A | 3/1999 | Jung | 320/106 |
| 5,903,764 | A | 5/1999 | Shyr et al. | 395/750.01 |
| 5,923,148 | A | 7/1999 | Sideris et al. | 320/116 |
| 5,936,385 | A | 8/1999 | Patillon et al. | 320/136 |
| 5,949,219 | A | 9/1999 | Weiss | 320/136 |
| 5,994,876 | A | 11/1999 | Canny et al. | 320/132 |
| 6,001,506 | A | 12/1999 | Timmons et al. | 429/178 |
| 6,137,264 | A * | 10/2000 | Downs et al. | 320/133 |
| 6,163,245 | A * | 12/2000 | Andoh et al. | 338/21 |
| 6,285,164 | B1 | 9/2001 | Noda et al. | 320/132 |
| 6,399,244 | B1 | 6/2002 | Hinotu et al. | 429/179 |
| 6,507,196 | B2 * | 1/2003 | Thomsen et al. | 324/436 |
| 6,573,723 | B2 | 6/2003 | Baston | 324/426 |
| 6,628,102 | B2 | 9/2003 | Batson | 320/128 |

OTHER PUBLICATIONS

Microchip Technology Inc., 12V Battery Monitor with LIN Communications Interface, DS21803A, pp. 1-4.

* cited by examiner

BATTERY COVER ASSEMBLY HAVING INTEGRATED BATTERY CONDITION MONITORING

RELATED PATENT AND PATENT APPLICATION

This application is a continuation-in-part patent application of commonly owned U.S. patent application Ser. No. 10/419,600, filed Apr. 21, 2003, now U.S. Pat No. 7,012,404 entitled "A Battery Cover Assembly Having Integrated Battery Condition Monitoring" by David C. Batson, which is a continuation patent application of Ser. No. 10/010,693, filed Dec. 5, 2001, now U.S. Pat. No. 6,628,102 B2, issued Sep. 30, 2003, which also claims priority to provisional U.S. Patent application Ser. No. 60/282,133, filed on Apr. 6, 2001, all of which are assigned to the assignee of the present patent application, and all of which are hereby incorporated by reference herein for all purposes.

BACKGROUND OF THE INVENTION TECHNOLOGY

1. Technical Field of the Invention

The present disclosure relates to batteries and, more particularly, to an integrated battery cover assembly having integrated battery condition monitoring. Even more particularly, the integrated battery condition monitoring includes current and voltage monitoring of a battery integral therewith.

2. Background of the Related Technology

The present disclosure is described in conjunction with a lead-acid battery of the type used to provide starting power for the internal combustion engine in vehicles, such as automobiles, trucks and motorcycles and or motive power for electric and hybrid-electric vehicles, and the like. This type of battery generally includes a plastic casing containing positive and negative lead plates immersed in an acid electrolyte. The plates are separated by non-conductive sheets, and a positive lead strap connects the positive plates while a negative lead strap connects the negative plates. Lead posts are connected to each strap and extend through the casing, and lead positive and negative battery terminals are secured to the ends of the posts outside the casing for receiving cable connectors.

In present day vehicle systems there is generally no means to ascertain the status of the battery beyond the alternator output voltage. Presently, means for monitoring the status of batteries normally measures the voltage provided between the battery terminals. However, battery voltage in itself provides limited information as to battery status and performance beyond measurement of open circuit voltage and an estimate of the battery state-of-charge based on the measured open circuit voltage. What is desired instead is an integral intelligent battery which provides means for measuring the flow of current into and out of the battery as well as the battery terminal voltage and battery temperature and contains electronics means to communicate and analyze these battery measures. The measures of current, voltage and temperature can then be used over time to calculate and monitor the level of charge of the battery. The preferred battery design solution would also provide means to incorporate microelectronic circuitry capable of utilizing these measures without adversely impacting the size and utility of the subject battery. The integrated microelectronic circuitry is then utilized to provide analysis and communication of battery performance and remaining capacity based on these measures. Preferably, the terminal assembly and cover assembly will be simple in design, and easily incorporated in a battery within the battery manufacturers current manufacturing capabilities. What is also desired is a battery cover assembly having integrated battery condition monitoring of battery current and voltage.

SUMMARY OF THE DISCLOSURE

In response, the present disclosure provides a battery cover assembly that provides means for measuring electrical current passing to and from a battery post, and means to measure the battery terminal voltage, as well as means to integrate electronic circuitry within the existing physical envelope of the battery. The battery cover assembly further incorporates at least one terminal assembly for the measurement of current flow. The terminal assembly includes an electrically conductive collar having an inner surface for connecting to a battery post and an outer surface, and an electrically conductive terminal having an outer surface for receiving a cable connector, for example, of a vehicle. The assembly also includes an electrically conductive resistor having a known resistance extending between the outer surfaces of the collar and the terminal. Current flow from the battery post travels through the resistor from the collar to the terminal and current flow to the post travels through the resistor from the terminal to the collar.

According to one aspect, the resistor of the terminal assembly is made from a metallic alloy material including manganese, nickel and copper, which provides a very low temperature coefficient of resistivity.

The present disclosure also provides a battery post cover for receipt on a battery having at least one battery post extending therefrom. The cover includes the terminal assembly discussed above and further includes a first surface having a terminal port, a second surface having a post port, and wherein the cover defines a closed chamber. A circuit board is received in the closed chamber, and the terminal assembly is received in the cover with the terminal extending out of the terminal port and the collar positioned in the post port for receiving a battery post. Leads extend from the outer surfaces of the terminal and the collar of the terminal assembly into the closed chamber of the cover, and are electrically connected to the circuit board. These leads further provide the means to mechanically secure the circuit board to the cover as well as provide the electrical connections to the current sensing resistor and the opposing polarity battery terminal to measure battery terminal voltage.

According to one aspect of the present disclosure, a voltage measuring means is mounted on the circuit board and connected between the first and the second leads of the terminal assembly for measuring the voltage drop across the resistor.

According to another aspect of the present disclosure, a voltage measuring means is mounted on the circuit board and connected between the first leads of the terminal assembly and the leads of the opposing polarity battery terminal for measuring the voltage potential across the battery terminals.

According to another aspect, a computer is also mounted on the circuit board. The computer has memory storing the known resistance of the resistor, and a processor programmed to receive the measured voltage drop from the voltage measuring means, retrieve the known resistance from the memory, and calculate current flow through the resistor based on the measured voltage drop and the known resistance.

According to a further aspect, the battery post cover includes a temperature measuring device for measuring an actual temperature of the resistor, and in the memory of the computer a temperature coefficient of resistivity for the resistor may be stored. In addition, the processor is programmed to receive the actual temperature from the temperature measuring device, retrieve the temperature coefficient of resistivity from the memory, calculate an actual resistance of the resistor based on the known resistance, the temperature coefficient of resistivity, and the actual temperature, and calculate actual current flow through the resistor based on the measured voltage drop and the actual resistance of the resistor.

The present disclosure also provides a battery including the battery post cover, and further including a case, a storage cell contained within the case for receiving and storing an electrical charge, and an electrically conductive post connected to the storage cell and extending out of the case. The post extends into the post port of the cover and is received by the collar of the terminal assembly.

According to one aspect of the present disclosure, the storage cell of the battery includes lead and lead-oxide plates immersed in an acid electrolyte.

These and other aspects of the present disclosure will become apparent from the following description of the embodiments, given for the purpose of disclosure and taken in conjunction with the accompanying drawings.

BRIEF DESCRIPTION OF THE DRAWINGS

A more complete understanding of the present disclosure and advantages thereof may be acquired by referring to the following description taken in conjunction with the accompanying drawings, wherein.

Figure 1:
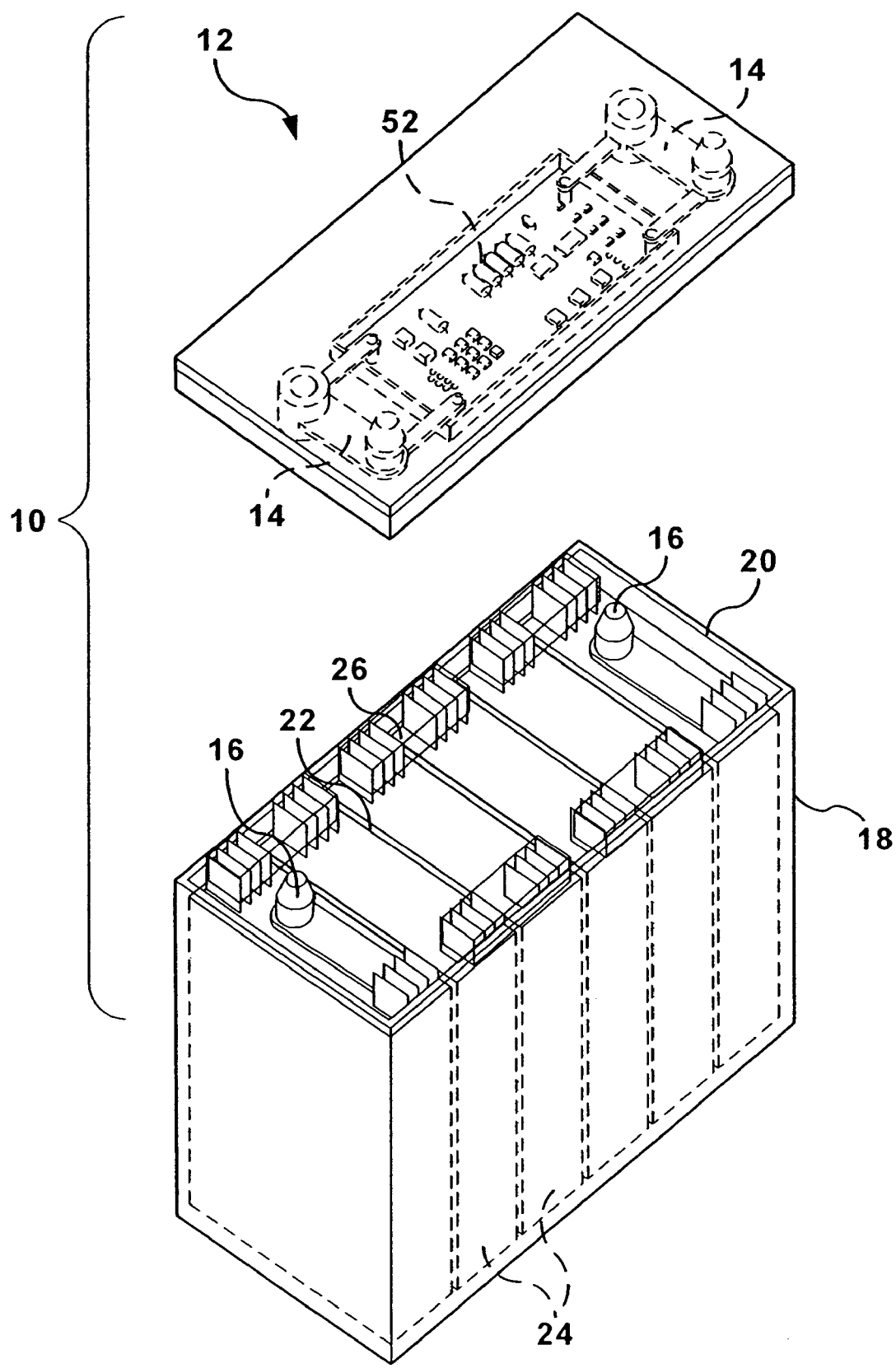
FIG. 1 is an exploded perspective end view of a battery constructed in accordance with the present disclosure.

While the present invention is susceptible to various modifications and alternative forms, specific exemplary embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Referring now to the drawings, the details of specific embodiments of the invention are schematically illustrated. Like elements in the drawings will be represented by like numbers, and similar elements will be represented by like numbers with a different lower case letter suffix.

Figure 2:
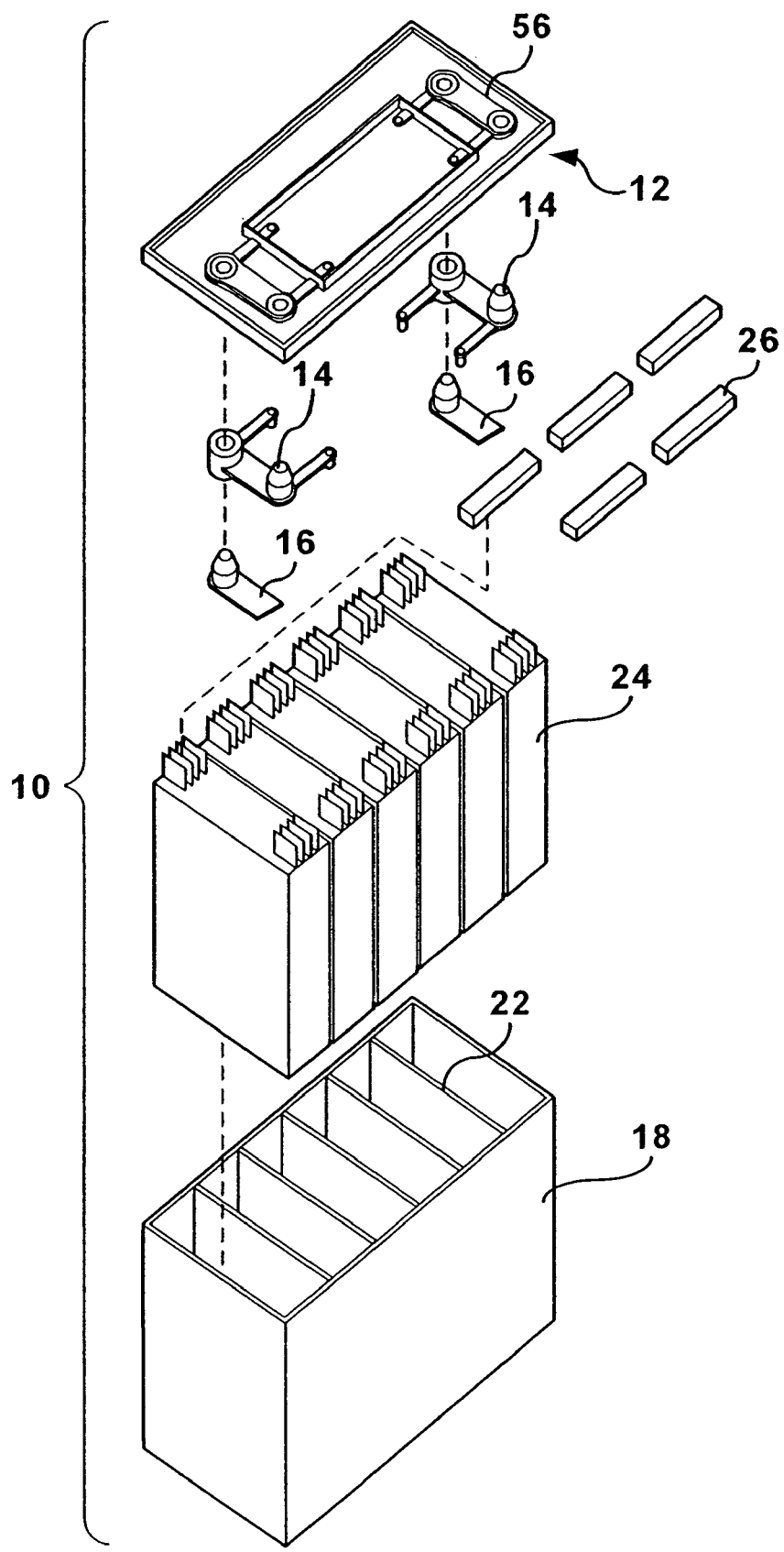
FIG. 2 is a reduced, exploded perspective side view of the battery of FIG. 1, with an outer portion of a cover of the battery not shown.
Figure 3:
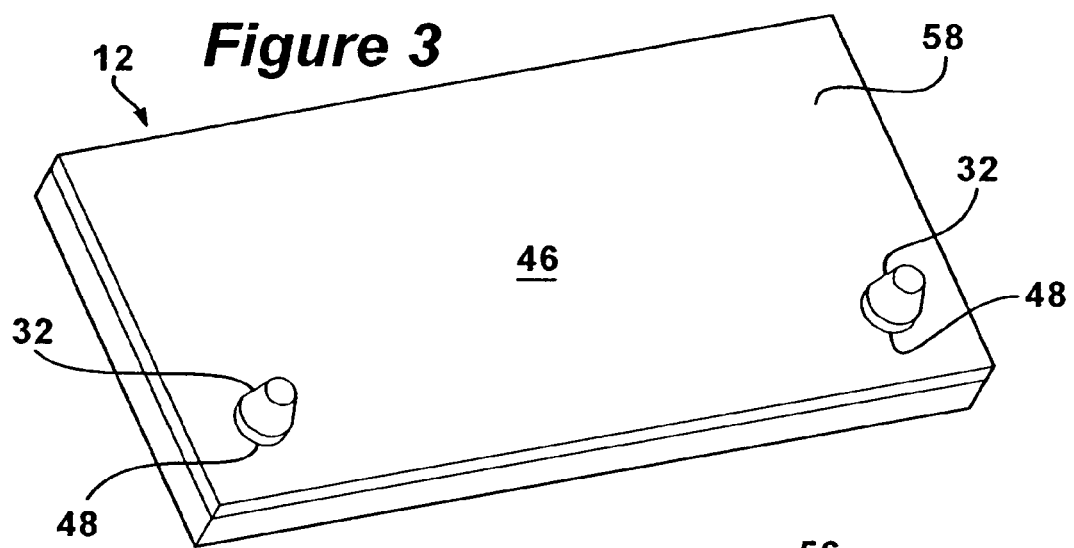
FIG. 3 is an enlarged perspective top view of a cover of the battery of FIG. 1.
Figure 4:
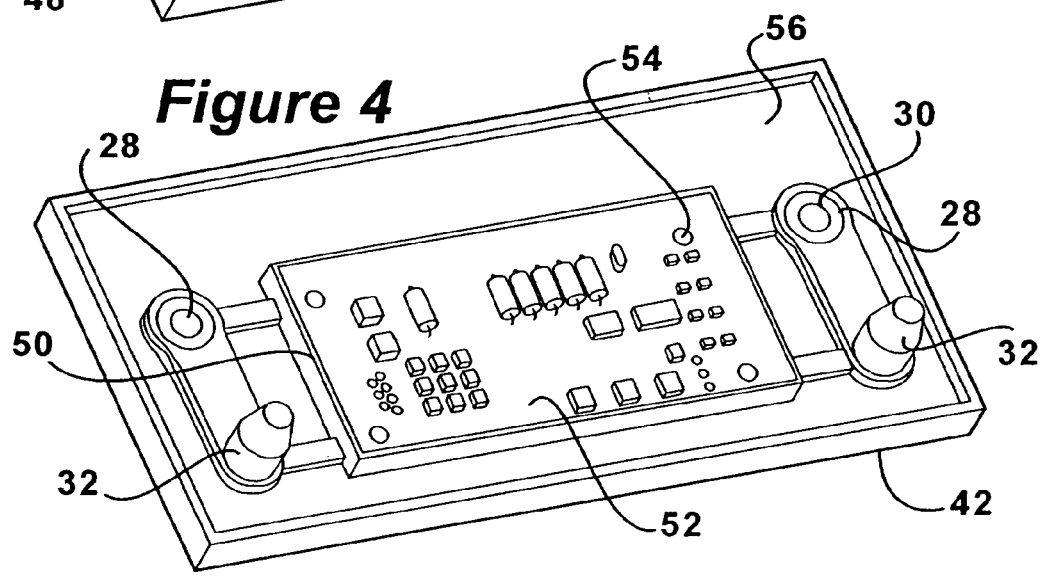
FIG. 4 is an enlarged perspective top view of an inner portion of the cover of the battery of FIG. 1, including a circuit board and two terminal assemblies.
Figure 5:
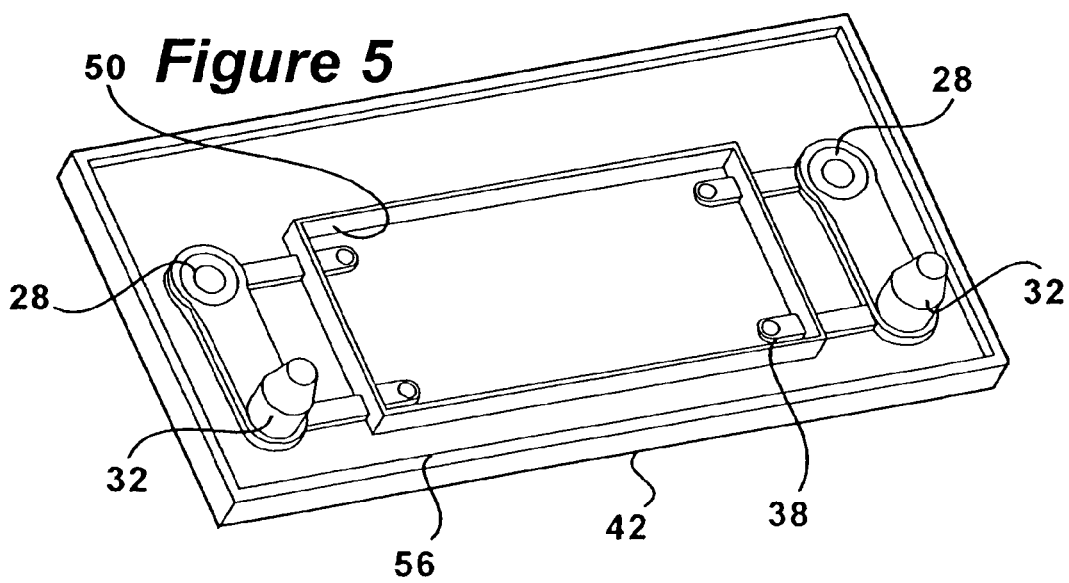
FIG. 5 is an enlarged perspective top view of an inner portion of the cover of the battery of FIG. 1, including the two terminal assemblies.
Figure 6:
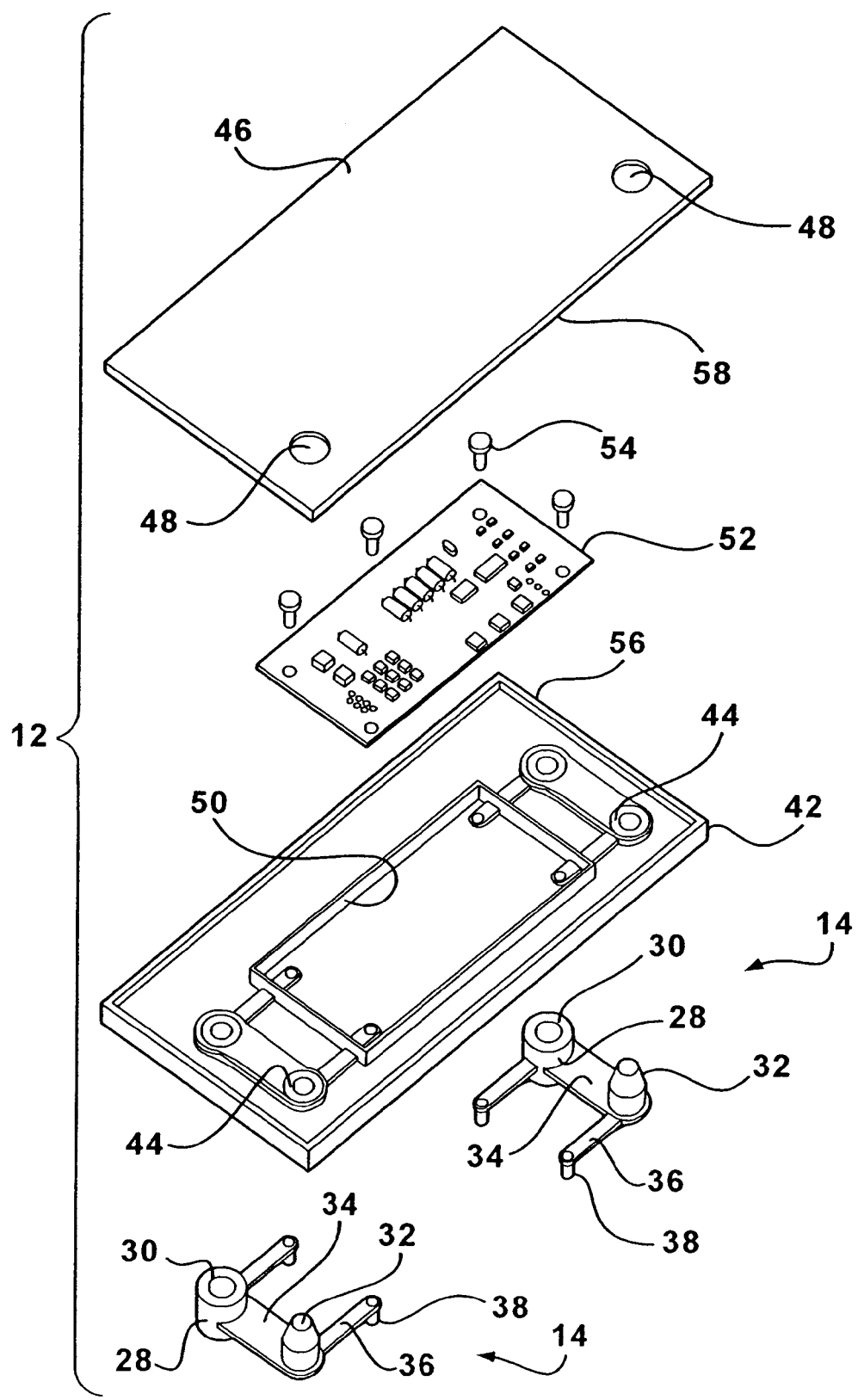
FIG. 6 is an enlarged, exploded perspective side view of the cover of the battery of FIG. 1, including the outer portion, the inner portion, the circuit board, and the two terminal assemblies.
Figure 7:
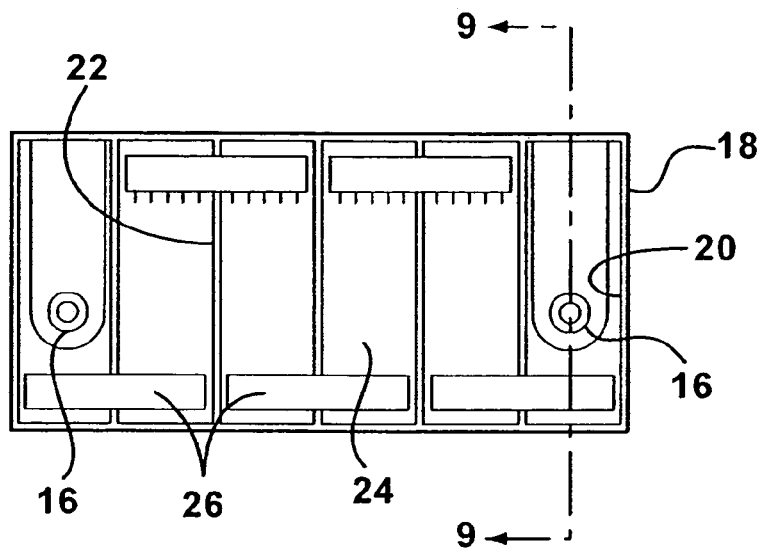
FIG. 7 is a top plan view of the battery of FIG. 1, with the cover of the battery removed.
Figure 8:
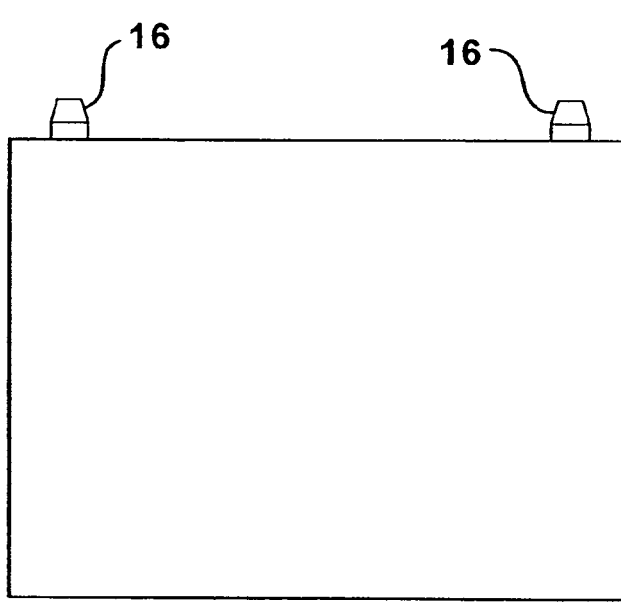
FIG. 8 is a side elevation view of the battery of FIG. 1, with the cover of the battery removed.
Figure 9:
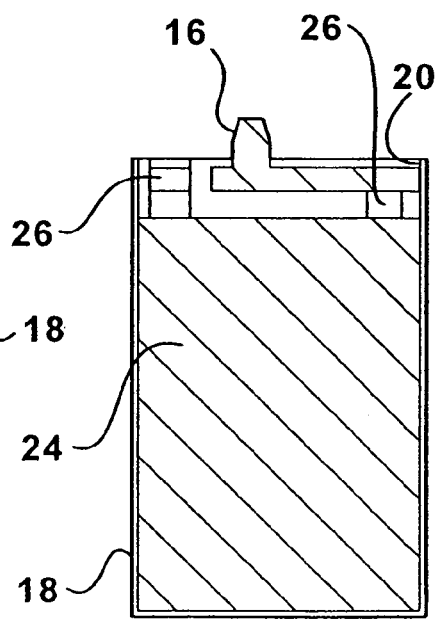
FIG. 9 is a sectional view of the battery of FIG. 1, without the cover, taken along line 9—9 of FIG. 7.
Figure 10:
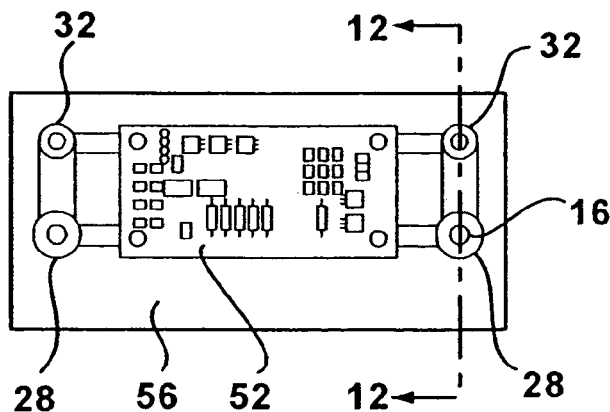
FIG. 10 is a top plan view of the battery of FIG. 1, with the outer portion of the cover removed.
Figure 11:
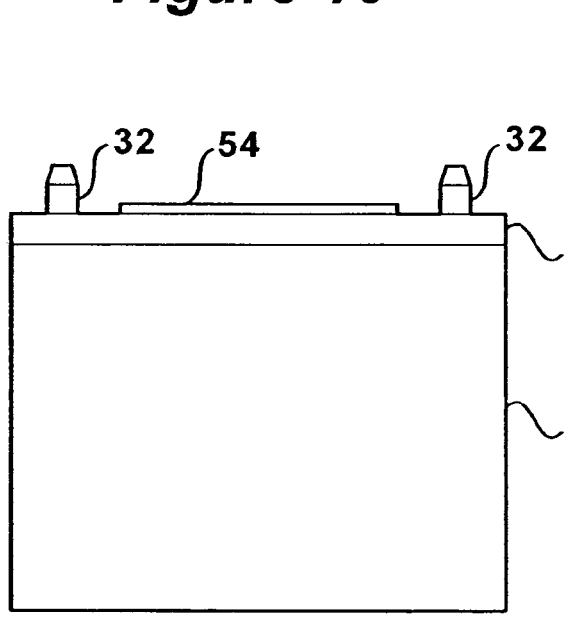
FIG. 11 is a side elevation view of the battery of FIG. 1, with the outer portion of the cover removed.
Figure 12:
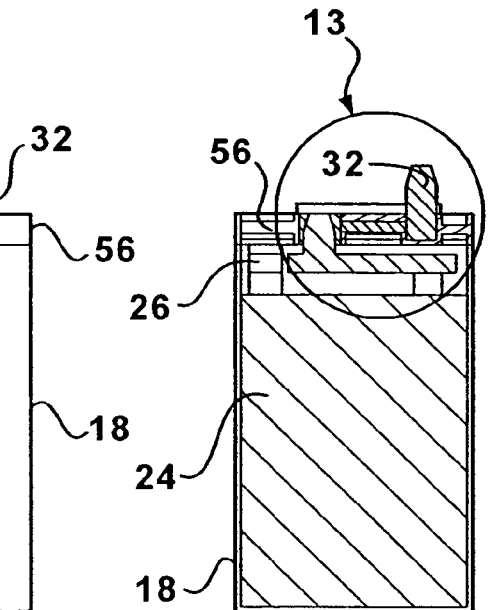
FIG. 12 is a sectional view of the battery of FIG. 1, with the outer portion of the cover removed, taken along line 12—12 of FIG. 10.
Figure 13:
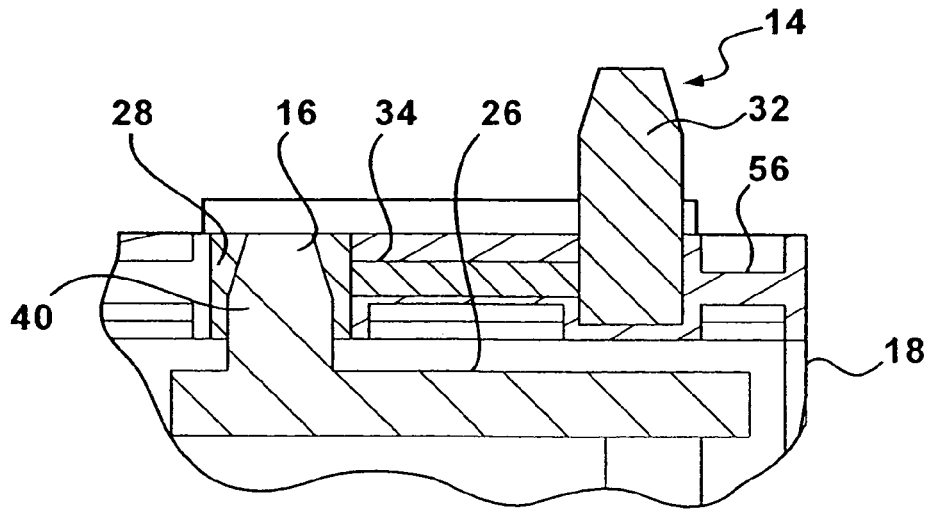
FIG. 13 is an enlarged sectional view of the battery of FIG. 1, with the outer portion of the cover removed, and as contained within the circled portion 13 of FIG. 12.

Referring to FIGS. 1 through 13, the present disclosure provides a battery 10 including a battery cover assembly 12 comprising terminal assemblies 14 adapted for the measurement of electrical current passing to and from posts 16 of the battery 10 and voltage therebetween, and a circuit board 52 used for monitoring the current and/or the voltage of the battery. The battery 10 is generally similar to typical lead-acid batteries used in powering vehicles, such as trucks, automobiles, motorcycles, and the like. It should be understood, however, that the present disclosure can be used with many different types of batteries other than lead-acid batteries, e.g., nickel metal hydride, lithium ion, and lithium polymer batteries.

As shown in FIGS. 1, 2 and 7 through 13, the battery 10 includes a plastic casing 18 having an open top 20 and cell dividers 22 separating cells 24. Each cell 24 contains positive and negative lead plates separated by non-conductive sheets and immersed in an acid electrolyte. The battery 10 also includes lead straps 26 connecting the positive plate in one cell 24 to a negative plate in an adjacent cell 24. The positive lead post 16 is connected to the most positive plate, while the negative lead post 16 is connected to the most negative plate (i.e., the positive and negative plates are connected in series). Both posts 16 extend out of the open top 20 of the case 18.

Figure 14:
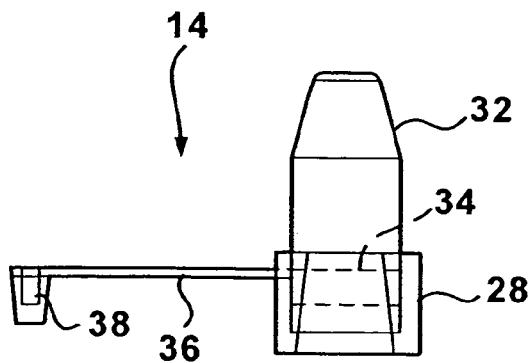
FIG. 14 is a side elevation view of one of the terminal assemblies of the battery of FIG. 1.
Figure 15:
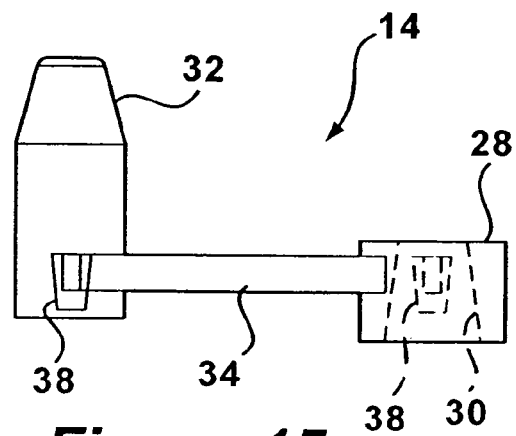
FIG. 15 is an end elevation view of the terminal assembly of the battery of FIG. 1.
Figure 16:
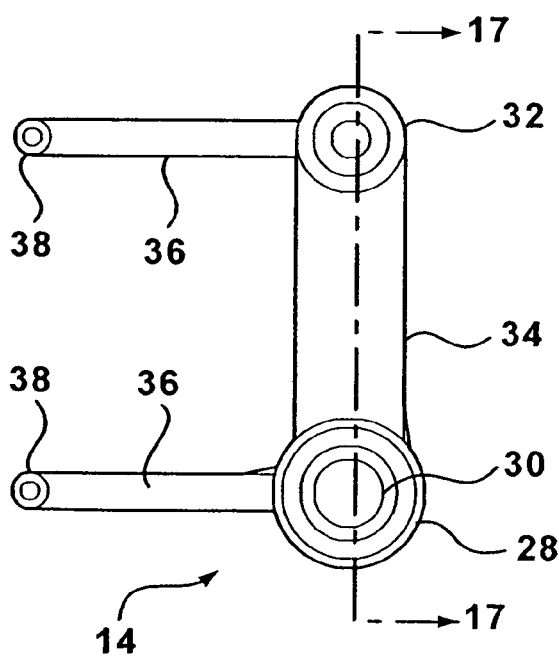
FIG. 16 is a top plan view of one of the terminal assembly of the battery of FIG. 1.
Figure 17:
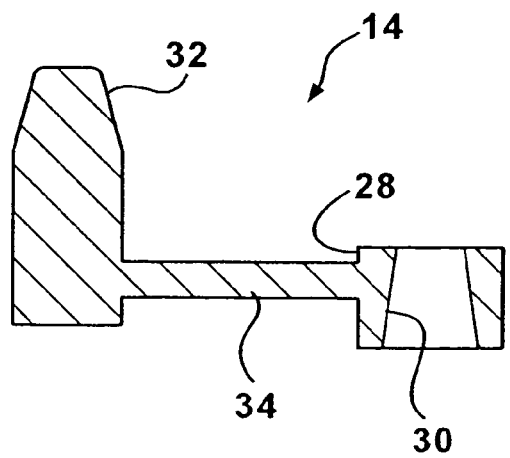
FIG. 17 is a sectional view of the terminal assembly of the battery of FIG. 1, taken along line 17—17 of FIG. 16.

Referring now to FIGS. 1, 2 and 14 through 17, each terminal assembly 14 includes an electrically conductive collar 28 having an inner surface 30 for contacting the battery post 16, and an electrically conductive terminal 32 for receiving a connector (not shown) of a load, such as a cable clamp of a vehicle. Each assembly 14 also includes an electrically conductive shunt resistor 34 having a known resistance "R" extending between outer surfaces of the collar 28 and the terminal 32. Current flow "I" from the battery post 16 travels through the resistor 34 from the collar 28 to the terminal 32 and current flow to the battery post 16 travels through the resistor 34 from the terminal 32 to the collar 28. Leads 36 extend from the outer surfaces of the collar 28 and the terminal 32 for measuring a voltage drop "v" across the resistor 34. The leads 36 may include threaded connectors 38, as shown.

The known resistance "R" of the resistor 34 may be calculated by multiplying the ratio of length of the resistor 34 divided by the cross sectional area of the resistor 34 by the resistivity of the material that the resistor 34 is made of. The material from which the terminal assembly 32 is made can be lead or a non-lead material, as long as the resistance "R" of the resistor 34 is precisely known for purposes of determining current flow "I". Other conductive materials, such as copper, brass and bronze may alternatively be used, the material selection is based on the galvanic compatibility of the resistor 34 material with the electrochemical system being employed. Also, the resistor 34 can be made from commercially available alloy materials preferably having a very low temperature coefficient of resistivity, such as Manganin, to reduce the effects of temperature variation when determining current flow "I". The resistor 34 can be formed of powdered metal, stamped, machined, cast, or forged. The resistor 34 can also be insert cast with the collar 28 and the terminal 32 if the resistor 34 is made of different materials than the collar 28 and the terminal 32. In addition, the collar 28 and the terminal 32 can be plated or dipped in silver, gold, platinum or their alloys to provide a non-corrosive surface, and further dipped or coated with tin to provide better attachment between the lead battery post and plated collar 28. The inner surface 30 of the collar 28 is secured to the battery post 16, as shown best in FIG. 13, with lead solder 40 for example, to provide an electrical connection and to prevent electrolyte from leaking from the battery 10.

The resistor 34 is configured for use with a typical lead-acid vehicle battery 10 to measure currents between 0.5 amperes and 1000 amperes, with the resistor 34 being provided with a known resistance "R" of between about 50 microOhm and about 200 microOhm. Preferably, the resistor 34 is provided with a known resistance "R" of about 150 microOhm. The preferred resistance value, for a specific application, is determined based on a trade-off between current measurement accuracy and power dissipation at high current.

Referring to FIGS. 1 through 6, the cover portion of the battery cover assembly 12 may be made of a suitably rigid and durable plastic and includes a first surface 42 having two post ports 44, a second surface 46 having two terminal ports 48, and a substantially closed chamber 50 receiving a circuit board 52. The terminal assemblies 14 are received within the cover assembly 12 with the terminals 32 extending through the terminal ports 48, the collars 28 positioned within the post ports 44, and the leads 36 extending into the closed chamber 50 of the cover. The threaded connectors 38 of the leads 36 are electrically connected to lands of the circuit board 52 with fasteners 54, e.g., screws, rivets, etc.

A two-piece cover may be used for the battery cover assembly 12 for ease in manufacture, with the terminal assemblies 14 insert molded to an inner portion 56 of the cover. The inner portion 56 is secured to the battery case 18, through ultrasonic welding for example, such that the open top 20 of the case 18 is sealed shut in a fluid-tight manner. Then an outer portion 58 of the cover 12 is secured to the inner portion 56 to secure and protect the circuit board 52 within the cover. The cover assembly 12 may alternatively be formed as a single piece with the terminal assemblies 14 and the circuit board 52 insert molded therein, or may be constructed from more than two pieces.

Although not described in detail herein, the circuit board 52 has arranged and mounted thereon an electrical circuit including components such as a voltage measuring device, e.g., an analog-to-digital converter (ADC) connected to the leads 36 of at least one of the terminal assemblies 14 for measuring the voltage drops "v" across the resistors 34. The electrical circuit also includes a memory storing the known resistance "R" of the resistors 34 and a processor programmed to receive the measured voltage drop "v" from the voltage measuring device, retrieve the known resistance "R" from the memory, and calculate current flow "I" through the resistors 34 based on the measured voltage drop "v" and the known resistance "R". Other components of the circuit board 52 may include a processor coupled to the voltage measuring device, an indicator such as an LED, and a communications interface, e.g., CANbus, LINbus, RS-485, RS-232, USB., etc., for coupling the processor to a remote device such as a display screen mounted on the dashboard of a vehicle, or a personal computer with a keyboard, mouse and other user display devices. The LED may be located on or in the top cover portion of the battery cover assembly 12. In addition, an actuation switch may be similarly located on or in the top cover portion of the battery cover assembly 12. The communications interface may be unidirectional, e.g., only supplying information or it may be bi-directional, e.g., supplying information and receiving commands. An example of a circuit for use on the circuit board 52 is the PS3180 SmartShunt$^{(TM)}$ Battery Monitor available from the assignee of the present disclosure.

If the resistors 34 of the terminal assemblies 14 are made of a material having a relatively high temperature coefficient of resistivity, the circuit board 52 may be provided with a temperature measuring device, e.g., thermistor, a solid state silicon thermistor, RTD, and the like, for measuring an actual temperature of the resistors 34. In such a case, the memory of the circuit also stores a temperature coefficient of resistivity for the resistor 34, and the processor is further programmed to receive the actual temperature from the temperature measuring device, retrieve the temperature coefficient of resistivity from the memory, calculate an actual resistance of the resistor 34 based on the known resistance "R" (at a ideal temperature), the temperature coefficient of resistivity, and the actual temperature. The digital processor may also be programmed to calculate actual current flow through the resistor 34 based on the measured voltage drop and the actual resistance.

The circuit board 52 is preferably also provided with a clock and the digital processor may be programmed to calculate the total charge of the battery 10 based on the current flow "I" and the charge time (when current is provided to the battery 10) or the drain time (when current is taken from the battery 10).

The present disclosure, accordingly, provides a new and improved battery cover assembly 12 including terminal assemblies 14 for monitoring the terminal voltage, the flow of current into and out of the battery 10 and mechanically and electrically integrated electronic circuitry (e.g., circuit board 52) for the measurement and analysis of battery voltage and current. As preferred, the battery 10 and battery cover assembly 12 are simple in design, relatively inexpensive and capable of manufacture in high volumes. Certain modifications and improvements will occur to those skilled in the art upon a reading of the foregoing description. By way of example, the outer surfaces of the terminals 32 can include channels for dissipating heat. In addition, the battery cover assembly 12 disclosed herein can be modified so as able to be retrofit onto the covers of existing batteries. The battery cover assembly 12 can also be modified so as to include a single terminal assembly 14 for connection to either a positive or negative post 16 of a battery 10.

Furthermore, the circuit board 52 of the battery cover assembly 12 may be provided with additional features and abilities. These additional features and abilities may include, but are not limited to: Analysis of starting current to determine changes in battery response. Indication of pending battery failure by computation and evaluation of the battery internal impedance at high current. Digital communications with on-board engine and vehicle control computers to assist in electrical load management, thereby preventing deep discharge of the starting battery and resulting failure of the battery to start the vehicle engine in the near future. Algorithms in the processor to compute the battery State-of-Charge and remaining discharge time for cycling applications or vehicle batteries with heavy accessory loads, such as in Marine applications or heavy-duty commercial and military vehicle applications. Communications with an intelligent switch, could provide a very accurate low voltage disconnect device, such as is used presently in commercial trucks to prevent complete discharge of the starting batteries due to high parasitic loads in these vehicle types. The currently available low voltage disconnects are all based on battery voltage and are noted for poor accuracy. This intelligent battery could also evaluate the charging current accepted during constant voltage 'float' voltage combined with the battery internal impedance at high current to help determine the health of the battery and indicate when battery replacement is needed prior to a complete battery failure. This functionality may be communicated to the user via a three color LED display on the battery cover, that may be activated by a push button switch. The three color LED display may illuminate GREEN, indicating a healthy battery, YELLOW, indicating a marginal battery which should be serviced soon, and RED, indicating the battery should be replaced.

The invention of the disclosure, therefore, is well adapted to carry out the objects and attain the ends and advantages mentioned, as well as others inherent therein. While the invention has been depicted, described, and is defined by reference to specific embodiments of the invention, such references do not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described specific embodiments of the invention are exemplary only, and are not exhaustive of the scope of the invention. Consequently, the invention is intended to be limited only by the spirit and scope of the appended claims, giving full cognizance to equivalents in all respects.

What is claimed:

1. A battery cover assembly, comprising:
   a current measuring terminal assembly for measuring electrical current to and from a battery post, wherein the current measuring terminal assembly comprises
      an electrically conductive first collar coupled to a first battery post of a battery;
      an electrically conductive first terminal for coupling to an electrical load;
      a resistor having a known resistance, the resistor being connected between the first collar and the first terminal, wherein current flow from the first battery post travels through the resistor in a first direction and current flow to the first battery post travels through the resistor in a second direction;
      a first lead electrically coupled to a first end of the resistor proximate to the first collar, and
      a second lead electrically coupled to a second end of the resistor proximate to the first terminal;
   an electrically conductive second collar coupled to a second battery post of the battery;
   an electrically conductive second terminal for coupling to the electrical load;
   a first electrical conductor connected between the second collar and the second terminal;
   a third lead electrically coupled to the first electrical conductor approximate to the second collar;
   a current measuring device coupled to the first and second leads;
   a first voltage measuring device coupled to the first and second leads for measuring voltage drop across the resistor, wherein the voltage drop across the resistor is proportional to the current therethrough;
   a processor coupled to the first voltage measuring device;
   a non-volatile memory coupled to the processor and storing the known resistance of the resistor, wherein the processor is programmed to receive the measured voltage from the first voltage measuring device, retrieve the known resistance value from the non-volatile memory, calculate the current flowing through the resistor based upon the measured voltage and the known resistance;
   a communications interface coupled to the processor;
   a temperature measuring device coupled to the processor and in thermal communication with the resistor, wherein the temperature measuring device provides the resistor temperature to the processor; and
   a table of temperature coefficients of resistivity for the resistor stored in the non-volatile memory;
   wherein the processor calculates a temperature compensated resistance of the resistor based on a known resistance, the temperature coefficient of resistivity, and the measured temperature, and thereby calculates the current through the resistor based upon the measured voltage across the resistor and the temperature compensated resistance.

2. The battery cover assembly according to claim 1, further comprising a voltage measuring device coupled to the first and third leads for measuring voltage between the first and second battery posts.

3. The battery cover assembly according to claim 1, wherein the current measuring device comprises a voltage measuring device coupled to the first and second leads for measuring voltage drop across the resistor, wherein the voltage drop across the resistor is proportional to the current therethrough.

4. The battery cover assembly according to claim 1, further comprising a second voltage measuring device coupled to the process and to the first and third leads for measuring voltage between the first and second battery posts.

5. The battery cover assembly according to claim 4, wherein the processor calculates power from the battery based upon the measured voltages from the first and second voltage measuring devices.

6. The battery cover assembly according to claim 4, wherein the first and second voltage measuring devices are analog-to-digital converters.

7. The battery cover assembly according to claim 1, wherein the communications interface is selected from the group consisting of CANbus, LINbus, RS-484, RS-232 and USB.

8. The battery cover assembly according to claim 1, wherein the temperature measuring device is a thermistor.

9. The battery cover assembly according to claim 8, wherein the thermistor is a solid state silicon thermistor.

10. The battery cover assembly according to claim 1, wherein the temperature measuring device is an RTD.

11. The battery cover assembly according to claim 1, wherein the resistance of the resistor is from about 50 microOhms to about 200 microOhms.

12. The battery cover assembly according to claim 1, wherein the resistance of the resistor is about 150 microOhms.

13. The battery cover assembly according to claim 1 wherein material for the resistor is selected from the group consisting of lead, copper, brass, bronze, manganese and manganin.

14. The battery cover assembly according to claim 1, wherein material for the resistor is selected from the group consisting of powdered metal, stamped, machined, cast and forged.

15. The battery cover assembly according to claim 1, further comprising:
    a battery case; and
    at least one storage cell contained within the battery case for receiving and storing an electrical charge, wherein the first and second battery posts are coupled to the at least one storage cell.

16. The battery cover assembly according to claim 15, wherein the at least one storage cell is selected from the group consisting of Lead Acid, Nickel metal-hydride, Nickel cadmium, and Lithium ion.

17. The battery cover assembly according to claim 1, further comprising a clock coupled to the processor, wherein the processor is programmed to calculate a charge condition of the battery based upon charging current and time thereof.

18. The battery cover assembly according to claim 1, further comprising a clock coupled to the processor, wherein the processor is programmed to calculate a discharge condition of the battery based upon discharging current and time thereof.

19. The battery cover assembly according to claim 1, further comprising:
    an electrically insulated battery cover assembly base containing separate compartments for the processor and non-volatile memory, and the first voltage measuring device so as to prevent exposure to external environmental and battery electrolyte;
    a plastic cover attached to the battery cover assembly base so as to create a seal around the separate compartment; and
    a communications port coupled to the communications interface.

20. The battery cover assembly according to claim 19, further comprising a light emitting diode (LED) display in the plastic cover and coupled to the processor for visually communicating battery condition status.

21. The battery cover assembly according to claim 20, further comprising a switch located on the plastic cover and coupled to the processor, wherein manually activating the switch causes the processor to indicate on the LED display the battery condition status.

22. The battery cover assembly according to claim 20, wherein the LED display comprises a green LED to indicate a healthy battery, a yellow LED to indicate a marginal battery which should be service, and red LED to indicate the battery should be replaced.

23. The battery cover assembly according to claim 1, wherein the processor analyzes starting current to determine changes in battery response.

24. The battery cover assembly according to claim 1, wherein the processor analyzes starting current for determining changes in battery response.

25. The battery cover assembly according to claim 1, wherein the processor analyzes battery internal impedance at high current for determining pending battery failure.

26. The battery cover assembly according to claim 1, further comprising a control output for controlling an intelligent switch, wherein the intelligent switch disconnects the baffery from parasitic loads when a low voltage battery condition is detected.

* * * * *